United States Patent
Kadoya et al.

(10) Patent No.: US 7,417,873 B2
(45) Date of Patent: Aug. 26, 2008

(54) ELECTRONIC CONTROL UNIT AND METHOD THEREOF

(75) Inventors: Kiyoomi Kadoya, Hitachinaka (JP); Masahiro Sasaki, Hitachinaka (JP); Takuya Mayuzumi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 70 days.

(21) Appl. No.: 11/322,426

(22) Filed: Jan. 3, 2006

(65) Prior Publication Data

US 2006/0171127 A1    Aug. 3, 2006

(30) Foreign Application Priority Data

Jan. 4, 2005    (JP)    ............... 2005-000023

(51) Int. Cl.
*H05K 7/14* (2006.01)
*H05K 7/18* (2006.01)
(52) U.S. Cl. ...................... 361/797; 361/800
(58) Field of Classification Search ............. 361/760, 361/748, 679, 797, 800, 752; 428/411.1, 428/500, 901; 174/250, 256; 257/723–724, 257/678, 666

See application file for complete search history.

(56) References Cited

U.S. PATENT DOCUMENTS

| | | | |
|---|---|---|---|
| 4,882,298 A | | 11/1989 | Moeller et al. |
| 5,461,256 A | * | 10/1995 | Yamada et al. ............... 257/679 |
| 5,710,693 A | * | 1/1998 | Tsukada et al. ............. 361/686 |
| 6,373,711 B2 | * | 4/2002 | Yamauchi et al. ........... 361/752 |
| 6,378,774 B1 | * | 4/2002 | Emori et al. ................. 235/492 |
| 6,940,162 B2 | * | 9/2005 | Eguchi et al. ............... 257/723 |

FOREIGN PATENT DOCUMENTS

| | | |
|---|---|---|
| EP | 0 113 073 A1 | 7/1984 |
| JP | 08-070066 | 12/1996 |
| JP | 2004-111435 | 4/2004 |

OTHER PUBLICATIONS

European Search Report dated Jun. 1, 2006 (Five (5) Pages).

* cited by examiner

*Primary Examiner*—Hung S Bui
(74) *Attorney, Agent, or Firm*—Crowell & Moring LLP

(57) ABSTRACT

In resin-molded engine control unit, a coil, an electrolytic capacitor, a microprocessor, electronic parts and a connector terminal are mounted on a board. Inside a cover fixed on the board, a resin-free region is formed. The coil, the electrolytic capacitor and the microprocessor, which should not be sealed with resin, are mounted in the resin-free region, while the board and the electronic parts which are not capped by the cover are sealed with a resin.

7 Claims, 13 Drawing Sheets

ELECTRONIC CONTROL UNIT AND METHOD THEREOF

BACKGROUND OF THE INVENTION

The present invention relates to the structures of module units having electronic parts and waterproof connectors mounted on circuit boards and encapsulated therein by resin molding. In particular, the invention relates to a structure suitable for engine control units and other electronic control units installed in automobiles, ships, agricultural machines, engineering machines, electric generators, etc.

Recently, the thermal environments of engine control modules (hereinafter, denoted as "engine control units") used in automobiles, ships, agricultural machines, engineering machines and electric generators are getting harsher and harsher.

That is, the situation is: (1) while they were conventionally installed in cabins, installation in engine compartments and on-engine mount are becoming popular, exposing engine control units to higher temperatures; (2) the amounts of heat generated by engine control units are increasing due to the increasing load current to be controlled; and (3) due to their downsizing, the amounts of heat generated by engine control units are increasing per unit volume as well.

Conventionally, typical engine control units employ a non-watertight structure comprising a printed circuit board having electronic parts mounted thereon and a case to cover them. For installation in engine compartments, inexpensive engine control units have appeared with cases which are structurally improved in heat radiation and resistance.

However, on-engine mount units are used in a still harsher thermal environment. They are required to endure 120° C. or higher temperatures. Engine control units for installation in engine compartments cannot operate at temperatures higher than 100° C. and therefore can not cope with such an environment.

Although there are engine control units which employ a high heat radiation structure comprising a ceramic board and bare chips, this structure is expensive as compared to the conventional structure.

As a conventional technology to solve these problems, Japanese Patent Laid-Open No. 2004-111435 discloses a resin-molded high heat radiation and high reliability engine control unit capable of enduring higher temperatures and higher thermal dissipation.

In addition, Japanese Patent Laid-Open No. 1996-70066 discloses a structure in which a cavity is provided on only one side of a circuit board in a semiconductor device.

The conventional technology of Japanese Patent Laid-Open No. 2004-111435, which encapsulates all electronic parts by resin molding, has various problems.

For example, the internal electrolytic solution of an electrolytic capacitor used in an engine control unit usually causes a small amount of leakage to the outside due to gasification. Therefore, if the electrolytic capacitor is sealed with resin, the gasified electrolyte solution accumulates near an electrode of the electrolytic capacitor and may result in causing a short circuit. Although an electrolytic capacitor is usually provided with an explosion-protection valve to release the gas pressure, the gas pressure may rise since this function is disabled if the electrolytic capacitor is sealed with resin. Therefore, using this conventional technology with electrolytic capacitors is not practical.

Although ceramic capacitors, tantalum capacitors and like can be used as substitutes, they are expensive and have a disadvantage in terms of cost. In addition, while common rail systems are becoming popular for low-emission diesel engines in Europe, their engine control units must contain capacitors having large capacitance values which neither the ceramic capacitor nor the tantalum capacitor can have. Therefore, this requirement can not be met if the control unit is encapsulated simply by resin molding.

In addition, large coils used in engine control units are likely to change in properties if they are sealed with resin. Therefore, it is not preferable to seal coils with resin in resin-molded engine control units.

Further, each electronic control unit is recently required to be provided with a self-diagnosis function to detect abnormality in the system. If the system malfunctions, the system must record details of the abnormality in an internal storage device to allow later investigation. However, if the electronic unit is encapsulated by resin molding, it is not possible to probe or visually inspect the internal circuit and electronic elements after the occurrence of a trouble in the electronic circuit. This makes it difficult to determine the causes of abnormalities of the system.

In the case of Japanese Patent Laid-Open No. 1996-70066 which discloses a structure where a cavity is provided on only one side of the circuit board, it is not possible to contain large electronic parts such as pin insertion type ones although this is effective to semiconductor and other small parts.

SUMMARY OF THE INVENTION

It is an object of the present invention to provide an inexpensive and reliable resin-molded engine control unit where parts which should not be sealed with resin are mounted in resin-free regions.

To attain the aforementioned object, a representative electronic control unit of the present invention comprises: a board having a circuit formed thereon; an electrolytic capacitor and an electronic part which are mounted on the board; a connector which is connected to the circuit formed on the board and is provided with a terminal to electrically connect the circuit to the outside; and a cover which is fixed onto the board to cap the electrolytic capacitor; wherein the connector and the board are at least partially sealed with a resin and the electronic part is sealed with the resin.

Another representative electronic control unit of the present invention comprises: a board having a circuit formed thereon; electronic parts and an engine control microprocessor which are mounted on the board; a connector which is connected to the circuit formed on the board and is provided with a terminal to electrically connect the circuit to the outside; and a cover which is fixed onto the board to cap the microprocessor; wherein: the connector and the board are at least partially sealed with a resin and the electronic parts are sealed with the resin; and the inside of the cover is left as a resin-free region which is not filled with the resin.

Another representative electronic control unit of the present invention comprises: a board having a circuit formed thereon; a pin insertion type electronic part and a surface mount type electronic part which are mounted on the board; a connector which is connected to the circuit formed on the board and is provided with a terminal to electrically connect the circuit to the outside; and a cover which is fixed onto the board to cap the pin insertion type electronic part; wherein: the connector and the board are at least partially sealed with a resin and the surface mount type electronic part is sealed with the resin; and the inside of the cover is left as a resin-free region which is not filled with the resin.

Another representative electronic control unit of the present invention comprises: a board having a circuit formed thereon; a first electronic part, a second electronic part and a third electronic part which are mounted on the board; a connector which is connected to the circuit formed on the board and is provided with a terminal to electrically connect the circuit to the outside; a first cover which is fixed onto the board to cap the first electronic part; a second cover which is fixed onto the board to cap the second electronic part; and a resin with which the connector and the board are at least partially sealed and the third electronic part is sealed, wherein the inside of the first cover and the inside of the second cover respectively form resin-free regions which are not filled with the resin.

Another representative electronic control unit of the present invention comprises: a metal base; a printed board fixed onto the metal base; a cover fixed onto the printed board; an electrolytic capacitor, a coil and a microprocessor which are mounted inside the cover on the printed board; plural electronic parts which are mounted outside the cover on the printed board; and a connector which is provided with a terminal connected to the printed board; wherein: the printed board and the plural electronic parts outside the cover are sealed with a resin; and a space formed by fixing the printed board onto the metal base and the inside of the cover are resin-free regions which are not filled with the resin.

Another representative electronic control unit of the present invention comprises: a board having a circuit formed thereon; an electrolytic capacitor, a coil and a microprocessor which are mounted on a first main side of the board; a surface mount type electronic part which is mounted on a second main side of the board, opposite to the first main side; a first cover which is fixed onto the board to cap the electrolytic capacitor and the coil; a second cover which is fixed onto the board to cap the microprocessor; and a connector which is connected to the circuit formed on the board and is provided with a terminal to electrically connect the circuit to the outside; wherein: the board and the connector are at least partially sealed with a resin; and the inside of the first cover and the inside of the second cover are respectively resin-free regions which are not filled with the resin.

Another representative electronic control unit of the present invention comprises: a board having a circuit formed thereon; plural electronic parts mounted on the board; a wireless communication module mounted on the board; a connector which is connected to the circuit formed on the board and is provided with a terminal to electrically connect the circuit to the outside; and a plastic cover which is fixed onto the board to cap the wireless communication module; wherein: the wireless communication module has a wireless communication IC and a coil; the connector and the board are at least partially sealed with a resin and the plural electronic parts are sealed with the resin; and the inside of the plastic cover is left as a resin-free region which is not filled with the resin.

A representative method of the present invention for manufacturing an electronic control unit comprises the steps of: mounting first plural electronic parts and second plural electronic parts on a board having a circuit formed thereon; on the board, mounting a connector which is provided with a terminal to be used for connection to the circuit; attaching a metal base to the board; applying an adhesive to the first electronic parts; fixing a cover to the board and the first electronic parts so as to cap the first electronic parts; preparing a molding die and injecting a resin through the gate of the die in order to at least partially seal the board and entirely seal the second electronic parts; and removing the die.

Another method of the present invention for manufacturing an electronic control unit comprises the steps of: mounting an electrolytic capacitor, a microprocessor and plural electronic parts on a board having a circuit formed thereon; on the board, mounting a connector which is provided with a terminal to be used for connection to the circuit; attaching a metal base to the board; applying an adhesive to the electrolytic capacitor; fixing a cover to the board and the electrolytic capacitor so as to cap the electrolytic capacitor and microprocessor;

placing a resin pellet on the board and performing resin molding by thermally liquefying the resin pallet and closing the molding die; and removing the die.

If a configuration of the present invention is employed, parts which should not be sealed with resin can be mounted in resin-free regions. This makes it possible to provide an inexpensive and reliable electronic control unit.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

Figure 16:
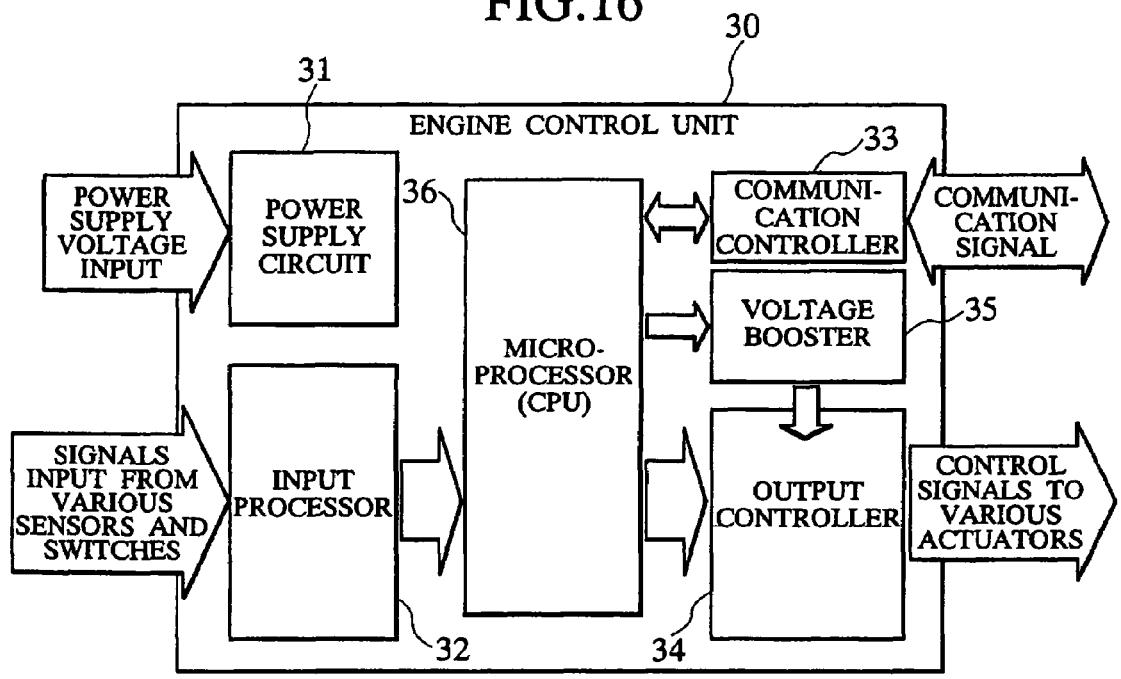
FIG. 16 is a block diagram of a typical engine control unit to which the present invention is applied.

FIG. 16 is a block diagram of a typical engine control unit 30 employed in each of the following embodiments of the present invention. The engine control unit 30 is composed mainly of a power supply circuit 31, an input processor 32, a communication controller 33, an output controller 34, a voltage booster 35 and a microprocessor 36.

Taking a power supply voltage from a battery or the like attached to the automobile into the engine control unit 30 via a connector, the power supply circuit 31 generates an internal reference power supply. The input processor 32 takes in sense signals and switch on/off signals from sensors and switches which are attached to the engine and various other sections of the automobile, performs noise reduction and waveform shaping on these input signals, gives them to the microprocessor 36. The communication controller 33 serves as an intermediary for communication signals when communication is made between the microprocessor 36 of the engine control unit 30 and an external unit. The output controller 34 receives instructions from the microprocessor 36 and outputs signals to drive the actuators of the injectors and other various actuators attached to the engine and other various sections of the automobile. By using the power supply voltage entered into the engine control unit 30, the voltage booster 35 generates a voltage which is boosted to a desired level according to a signal from the microprocessor 36 when high voltage/current is required to drive extra-high pressure injectors. The microprocessor 36 operates on the input signals from the respective sections of the engine control unit 30 according to built-in programs and the results to the respective sections.

Figure 17:
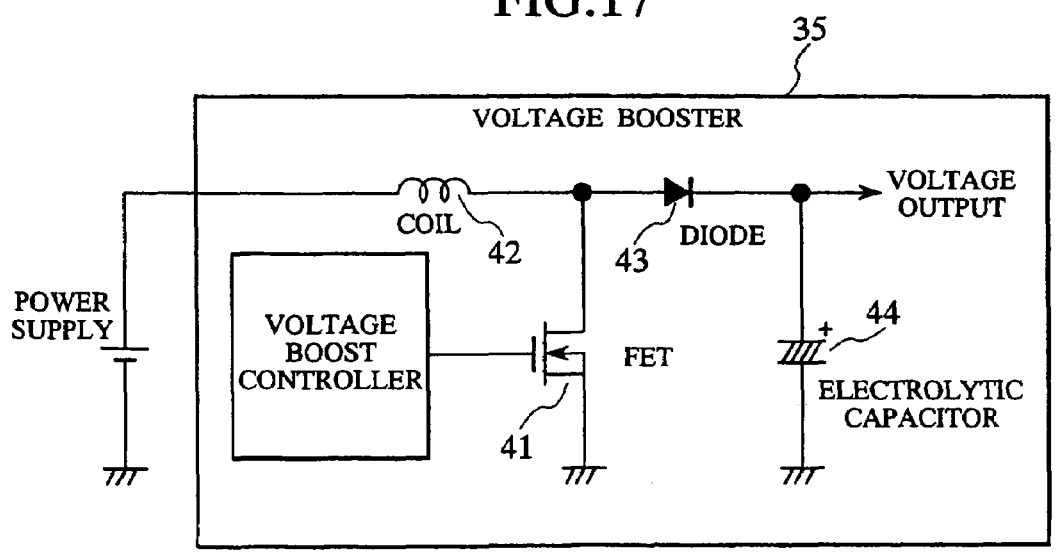
FIG. 17 schematically shows the circuit of the voltage booster shown in FIG. 16.

FIG. 17 schematically shows a typical configuration of the voltage booster 35. This voltage booster 35 functions to accumulate the back electromotive energy, which is generated by a coil 42 when the state of a switching device (FET) 41 is changed from ON to OFF, in a capacitor 44 via a diode 43. An inexpensive aluminum electrolytic capacitor or the like is suitable as the capacitor 44 since it is required to have a large capacitance and a high electric strength. The coil 42, the diode 43 and the electrolytic capacitor 44 generate large amounts of heat since large current flows through them. The temperature of the diode 43 can be suppressed if a diode having a radiation fin is chosen. However, products having heat radiation structures integrated are not available for the coil 42 and the electrolytic capacitor 44. Preferably, additional structures to promote heat radiation are therefore employed for the coil 42 and electrolytic capacitor 44 as described later.

Figure 18:
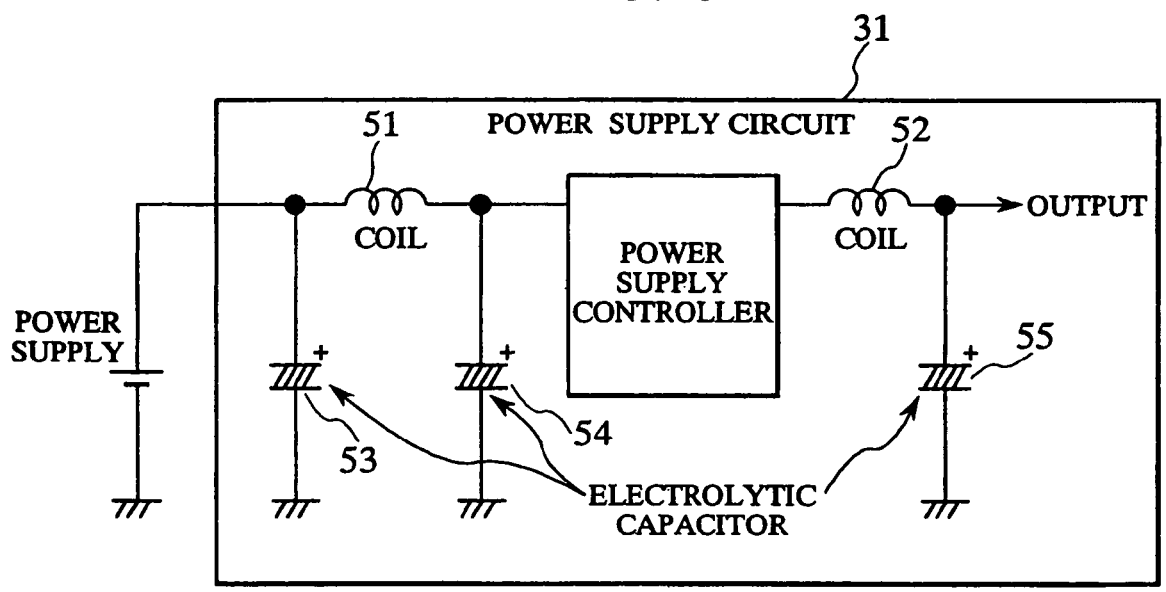
FIG. 18 schematically shows the configuration of the power supply circuit.

FIG. 18 schematically shows a typical configuration of the power supply circuit 31. After passing a filter composed of a coil 51 and capacitors 53 and 54, the power supply voltage input to the engine control unit 30 is guided to the power supply circuit 31 and converted there to a reference power supply. Before the reference power supply is output to various sections of the control unit 30, noise is removed through another filter composed of a coil 52 and capacitor 55. Since the capacitors 53, 54 and 55 are required to have large capacity and high electric strength, inexpensive aluminum electrolytic capacitors and the like are appropriate.

Embodiment 1

Figure 1:
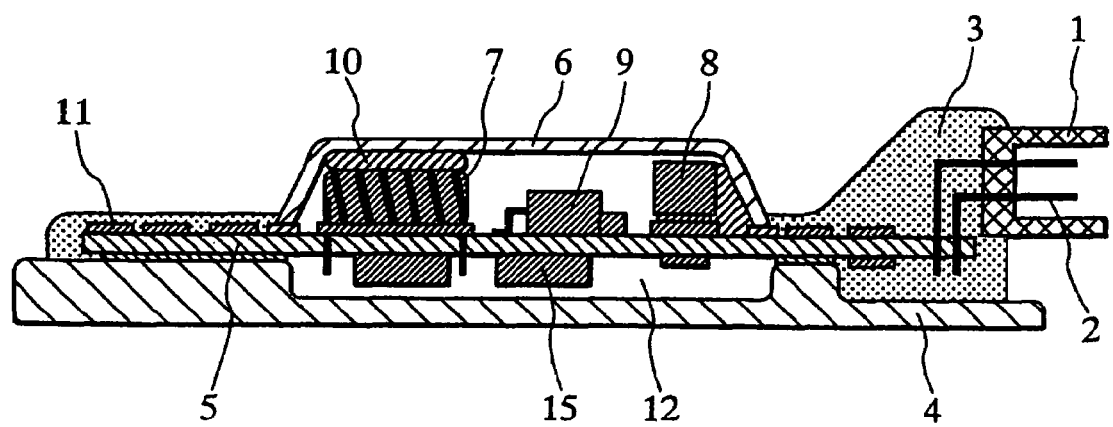
FIG. 1 is a cross sectional view of an engine control unit, a first embodiment of the present invention.
Figure 2:
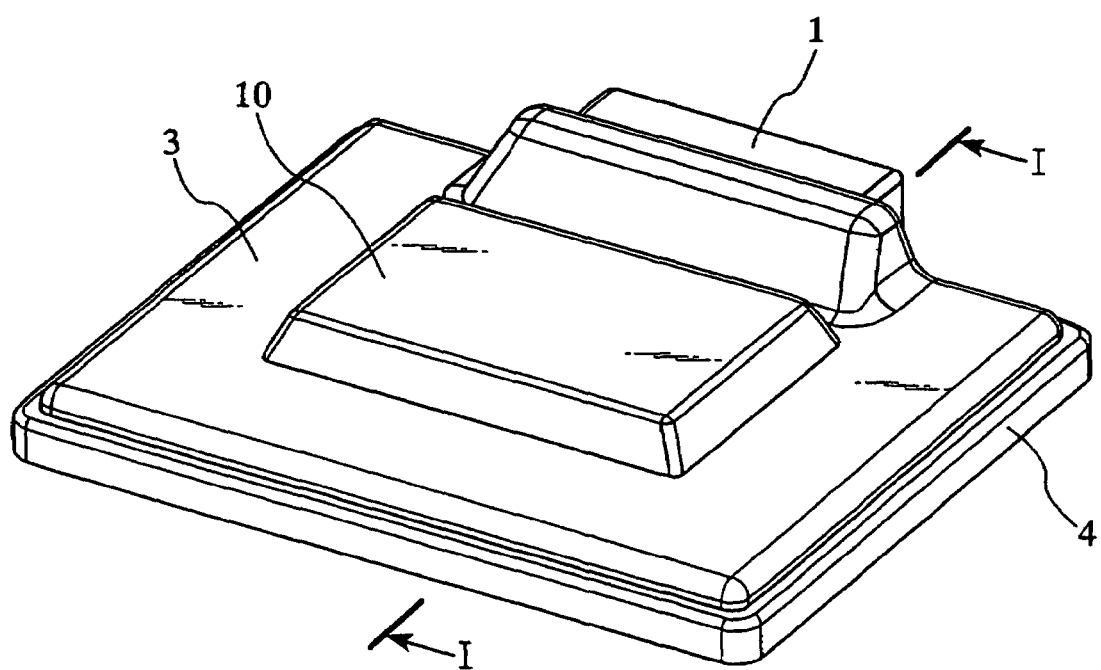
FIG. 2 is a perspective view showing the external appearance of the engine control unit which is the first embodiment of the present invention.
Figure 3:
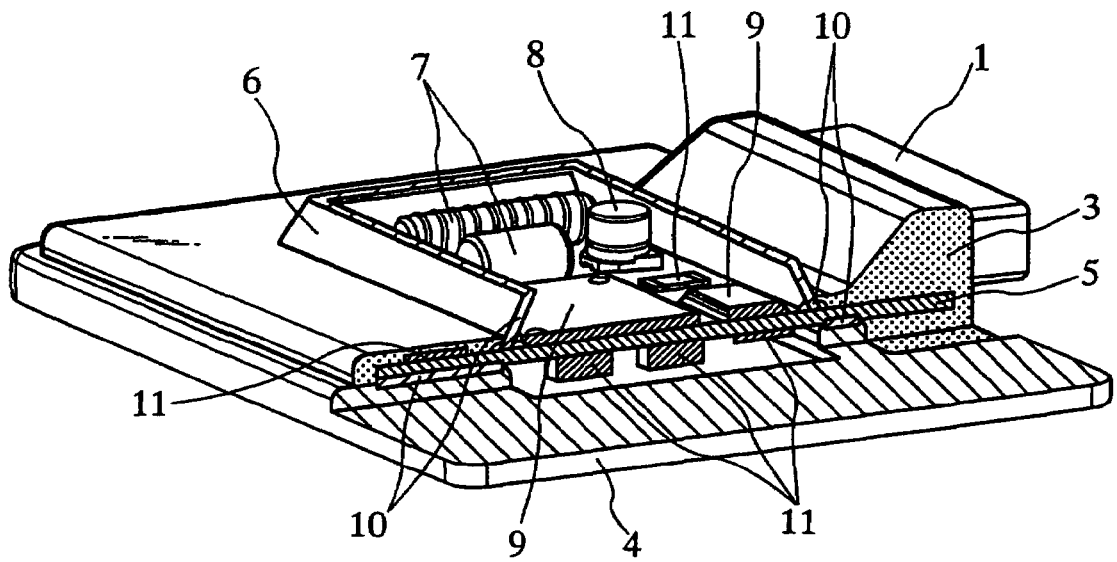
FIG. 3 is a perspective view showing the internal structure of the engine control unit with a cover opened, which is the first embodiment of the present embodiment.

FIG. 1 is a cross sectional view of an engine control unit, a first embodiment of the present invention. FIG. 2 is a perspective view showing the external appearance of the present engine control unit embodiment. FIG. 3 is a perspective view showing the internal structure of the engine control unit with a cover opened.

The cross sectional view of FIG. 1 shows a section cut along I-I in FIG. 2. 11 and 15 denote surface mount type small parts. For example, they are a resistor, capacitor, coil, crystal, diode, IC, FET, transistor, etc. 7 is a pin insertion type electronic part, typically, a coil which is difficult to seal with resin. Instead of a coil, the pin insertion type electronic part 7 may also be a resistor, capacitor, crystal, diode, IC, FET, transistor or the like. 8 is a surface mount type large electronic part, typically, an electrolytic capacitor which is difficult to seal with resin. Instead of an electrolytic capacitor, the surface mount type large electronic part may also be a resistor, coil, crystal, diode, IC, FET, transistor or the like. 9 is a surface mount type electronic part such as a microprocessor. Instead of a microprocessor, the surface mount type electronic part may also be a capacitor, coil, crystal, diode, resistor, IC or the like. 5 is an electronic circuit-formed board on at least one side of which the above-mentioned parts (11, 15, 7, 8 and 9) and others can be mounted.

1 is a connector and, more specifically, a waterproof connector. It has a terminal 2 to electrically connect the electronic circuit of the board 5 to an external circuit. If a molding resin 3 peels off from the housing of the waterproof connector 1, the entire waterproofness of the unit is broken. To prevent this, the waterproof connector 1 is preferably made of a plastic composed mainly of a polyamide or polybutyleneterephthalate which is enhanced in adhesion to epoxy resin in particular. It is also preferable to use a material which can endure the resin molding temperature 100° C. to 200° C. and the resin molding pressure of about 50 kgf/cm² without deformation and deterioration.

4 refers to a base. The base 4 serves to promote heat radiation from the board 5 and fix the board during resin molding and provides a means to attach the resin-molded engine control unit to an external mounting place. The base 4 is made typically but not exclusively of inexpensive aluminum or copper which shows good thermal conduction. The material may be another metal or the like as well.

The board 5 is fixed onto the base 4 by a binding substance 10. The main purpose of using the binding substance 10 is to improve electrical insulation and heat radiation. Preferably but not exclusively, the binding substance 10 is not thicker than 1 mm and consists of either a liquid adhesive or a sheet composed of a polyimide polyamide polyethyleneterephthalate core having both sides coated with a sticking agent. In addition, the binding substance 10 is preferably such that it can endure the resin molding temperature 100° C. to 200° C. without deterioration in electrical insulation and heat radiation.

The base 4 has a recess. Above the recess, a cover 6 is attached to the opposite side of the board 5. Although the engine control unit is generally sealed with a resin 3, the regions enclosed by the board 5 and the recess and by the board 5 and the cover 6 provide a resin-free space 12 which is not filled with the resin 3.

The main purpose of using the cover 6 is to form a resin-free space since parts which should not be sealed with resin are used. It also lowers the cost by reducing the amount of resin to be used, enlarges the resin-molded engine control unit, and improves heat radiation and noise immunity.

As the material of the cover 6, a plastic or metal is typically appropriate. If priority is not given to heat radiation, that is, if the main consideration is to provide a resin-free space in the resin-molded unit, lower the cost or prevent the communication electromagnetic wave from being blocked or the like, the cover 6 is made of a plastic.

When a plastic is used, its properties are preferably such that it can endure the resin molding temperature 100° C. to 200° C. without deformation and deterioration and the resin molding pressure of about 50 kgf/cm$^2$ without deformation.

To enhance the waterproofing, the plastic also preferably shows good adhesion to the molding resin 3 which is an epoxy resin, phenol resin or the like. In addition, if separation progresses at the interface between the cover 6 and the molding resin, this may reach the board 5 where an electronic circuit is formed, resulting in such circuit abnormalities as a malfunction of the electronic circuit and a short/damage therein. Therefore, the plastic used for the cover is also preferably such that the linear expansion coefficient is equal to or near to that of the molding resin ranging from 8 to 24 ppm/° C. By making the linear expansion coefficients nearer to each other, it is possible to reduce thermal stress between the cover and molding resin subject to heat cycles and therefore improve the adhesion between the cover 6 and the molding resin 3 or prevent separation between them.

To provide the present engine control unit embodiment with the ability to do wireless communication, a wireless communication module must be included. A wireless communication module comprises a wireless communication IC, coils, etc. If such a wireless communication module is sealed with resin, it is possible that its inductance and other characteristics may change, making communication impossible. Therefore, a wireless communication module is mounted inside of the cover 6 instead of being sealed with resin. To allow wireless communication with the outside, the cover 6 to protect the wireless communication module or the like is preferably made of a plastic or the like which substantially does not attenuate electromagnetic waves. This wireless communication module is mounted in order to, for example, exchange data with other control units by radio and conduct a failure check of the engine control unit. It can also be used for communication by a wireless LAN within the automobile.

If priority is given to heat radiation and noise immunity, the cover 6 is made of a metal. Similar to the plastic employed for the cover 6, the metal as the material of the cover 6 preferably has properties such that it can endure the resin 3 molding temperature of 100° C. to 200° C. and the resin 3 molding pressure of about 50 kgf/cm$^2$ without deformation and deterioration. To prevent separation between the cover and the molding resin, the metal is also preferably such that it shows good adhesion to the molding resin which is an epoxy resin, phenol resin or the like and the linear expansion coefficient is equal to or near to that of the molding resin ranging from 8 to 24 ppm/° C.

The noise immunity of the region enclosed by the metal cover 6 can be raised by electrically connecting the metal cover 6 to the circuit ground of the board 5 or to the case ground. How to electrically connect the metal cover 6 to the board 5 will be described later.

The metal cover 6 can serve as a heat sink. The electronic parts inside the metal cover 6 show good heat radiation if a high thermal conductivity adhesive 10 or the like is used between the metal cover 6 and the electronic parts mounted inside the metal cover 6 and the top surface of the metal cover 6 is exposed higher than the molding resin as shown in FIG. 2. This is particularly effective for heat radiation from the pin insertion type electronic part 7, which can not radiate heat to the base 4 via the board 5.

A heat sink may also be attached to the top of the cover 6. In this case, since the cover 6 of the present embodiment is relatively small as compared with the whole unit, it is easy to design the accuracy of the position of the heat sink, the clearance between the cover 6 and the electronic part, the degree of contact between them and the like.

For the resin 3, for example, a resin composed of an epoxy resin with a phenol resin hardener is used. Preferably, this resin has properties such that the linear expansion coefficient is 8 to 24 ppm/° C., the elastic modulus is 8 to 39 GPa and the glass transition temperature is 80 to 200° C.

Preferably, the board 5 is a flexible board composed of a polyimide resin and a liquid crystal polymer or a resin type printed board composed of epoxy and polyimide resins containing glass fibers. Flexible boards and printed resin boards are suitable since they have such advantages that they are inexpensive, they are hardly damaged thanks to high flexibility even when somewhat deformed and conventional technologies for mounting electronic parts can be used. If priority is given to high heat tolerance, a ceramic board may also be used as the board 5 of the present embodiment although ceramic boards have such disadvantages that they are expensive and fragile as compared with the above-mentioned ones.

In the present embodiment, the resin-free space on the top side of the board 5 is formed by the cover 6 while the resin-free space on the bottom side of the board 5 is formed by the base 4. These resin-free spaces can be formed within the resin-molded unit since the pressure which acts on the board 5 during resin molding is cancelled out. In addition, since each side of the board 5 is provided with a space, it is possible to contain a pin insertion type large electronic part which is difficult to seal with resin.

Figure 4A:
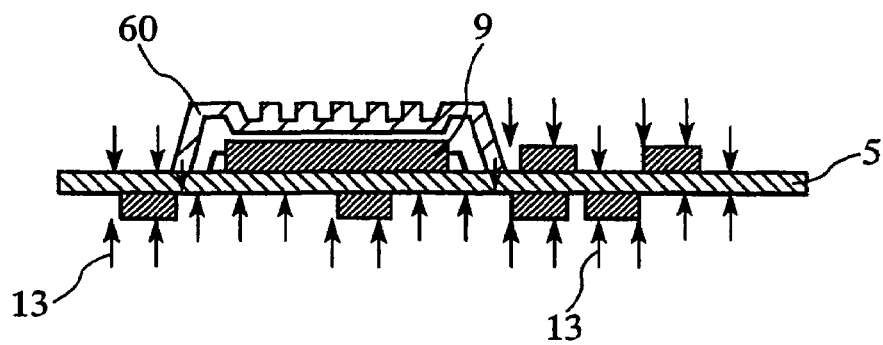
FIG. 4A is a cross sectional view to show an unbalanced distribution of stress acting on the electronic circuit and the board during resin molding, which is attributable to the attached cover.
Figure 4B:
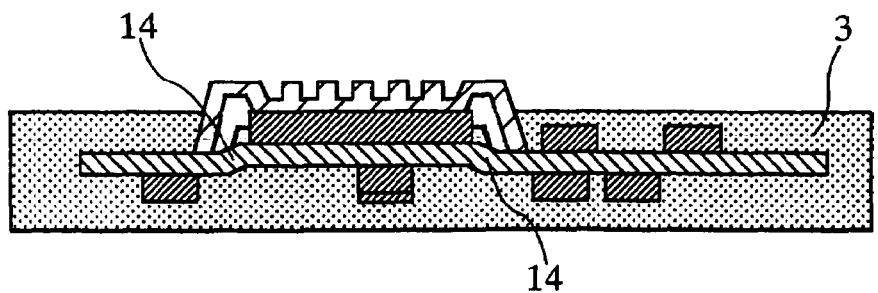
FIG. 4B is a cross sectional view of the result of resin-molding with the unbalanced distribution of stress acting on the electronic circuit and the board.
Figure 5A:
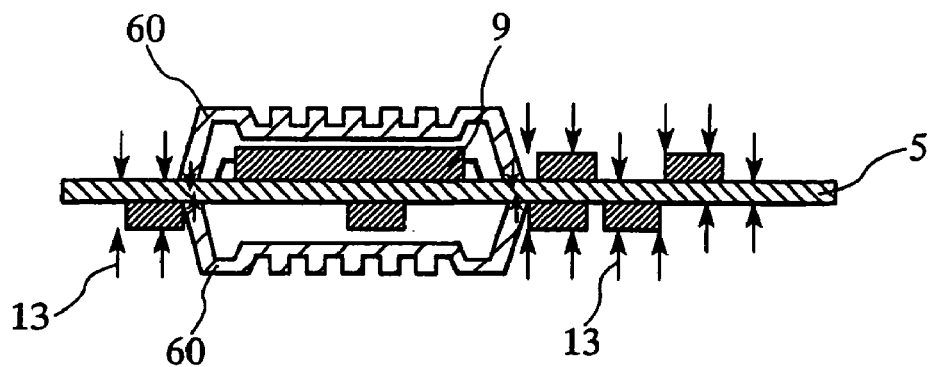
FIG. 5A is a cross sectional view to show a balanced distribution of stress acting on the electronic circuit and the board during resin molding, which is attributable to the attached cover.
Figure 5B:
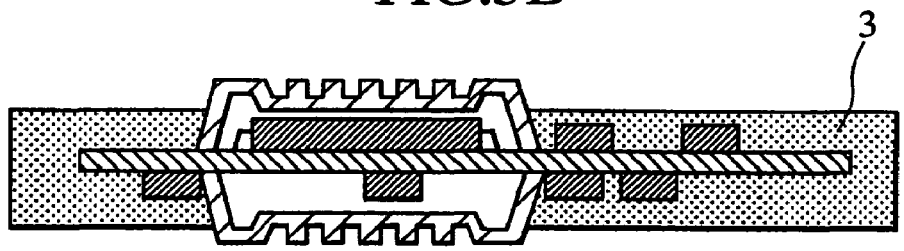
FIG. 5B is a cross sectional view of the result of resin-molding with the balanced distribution of stress acting on the electronic circuit and the board.

If a resin-free space is held during resin molding, pressure usually acts toward the inside of the space. Therefore, when the side of the board 5 opposite that on which the cover 6 is secured, is filled with the resin 3, stress 13 are caused to the board 5 as shown in FIG. 4A. This distribution of stress 13 may deform the board 5, resulting in a deformed portion 14 formed as shown in FIG. 4B. To reliably prevent the board 5 from being deformed, it is therefore preferable to form another resin-free space on the opposite side of the board 5 as shown in FIG. 5A and FIG. 5B. Since this resin-free space is formed just below or above the other one, the stress 13 which acts where the resin-free spaces are formed can be suppressed.

In addition, if a printed board having through holes is used as the board 5, the resin 3 tends to penetrate the board 5 into the resin-free space inside the cover 6 via through holes when the opposite side of the board is sealed with the resin 3. This also indicates that it is preferable to form a resin-free space on each of the top and bottom sides of the board 5. More preferably, the upper and lower resin-free spaces are designed to have the same projected area.

Preferably but not exclusively, the electrolytic capacitors which have large capacitance values and are difficult to seal with resin, the large coils which are likely to change in properties if sealed with resin and the microprocessor which controls an engine and may have to be examined for troubleshooting are mounted in the resin-free spaces.

In the case of a typical engine control unit encapsulated by resin molding, once sealed with resin, it is impossible to probe or visually analyze the electrical circuit even if some problem occurs. According to the present embodiment, however, the top portion of the cover 6 can be cut out and removed. Therefore, when the unit must be analyzed due to the occurrence of a problem, it is possible to probe or visually analyze the electrical circuit constituted by the parts mounted inside the cover 6.

If the construction of the present invention is employed, it is possible to mount parts which should not be sealed with resin. In particular, since a resin-free space is formed on each of the top and bottom sides of the board 5 by using the cover 6 and the base 4, a pin insertion type electronic part 7 can also be mounted in a resin-free space. Further, troubleshooting can be facilitated by cutting out the top portion of the cover 6.

Embodiment 2

Figure 6:
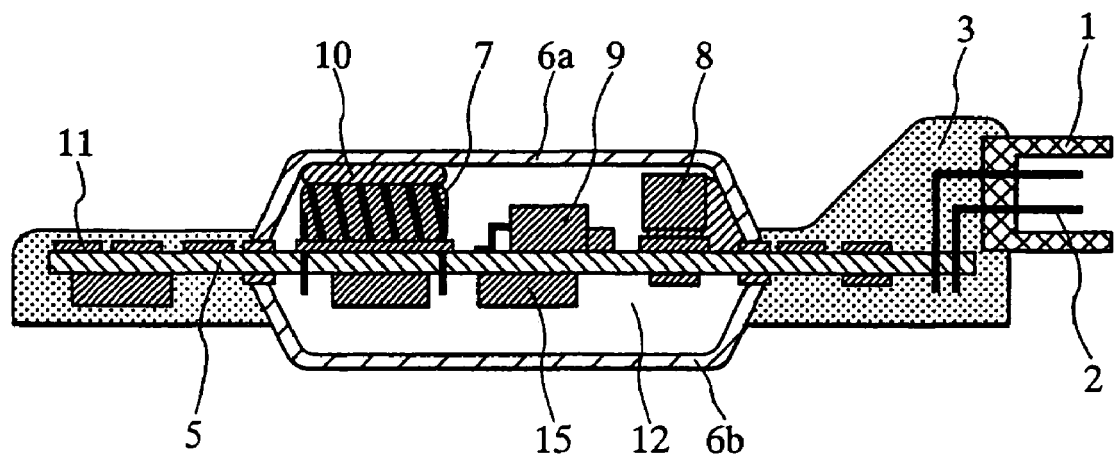
FIG. 6 is a cross sectional view of the structure of an engine control unit, a second embodiment of the present invention.

FIG. 6 shows a cross sectional view of an engine control unit according to a second embodiment of the present invention. Components that are identical to the corresponding ones in the first embodiment are given the same reference numeral in FIG. 6 as in FIG. 1, and their description is omitted.

In the present embodiment, a cover 6b is formed on the bottom side of the board 5 whereas the first embodiment has the base 4 formed thereon. Covers 6a and 6b are formed respectively on the top and bottom sides of the board before encapsulation by resin molding. Therefore, since the molding pressure does not act on the board area provided with the covers 6a and 6b during resin molding, it is possible to carry out resin molding without warping the board 5. In addition, since the base 4 is not necessary in the present invention, it is possible to provide a lower cost engine control unit than the first embodiment. Furthermore, because both covers 6a and 6b can be opened when troubleshooting analysis is necessary, the cause of the trouble can be located more easily.

If the covers 6a and 6b are enlarged so as to seal the board 5 almost completely, the structure is substantially identical to the typical waterproof three-piece structure comprising a board, a case, a cover and a sealant. In the present embodiment, the molding resin 3 serves as the sealant.

In the above case, since the covers 6a and 6b have almost the same size as the board 5, it is possible to analyze the whole internal circuit by opening the covers 6a and 6b if a trouble occurs. In addition, since the covers 6a and 6b occupy a larger area of the whole surface of the unit, the amount of the resin 3 to be used is reduced, making it possible to lower the cost.

In some case, a resin-molded engine control unit must be enlarged although the amount of resin to be used is limited. This can be attained by enlarging the covers 6a and 6b since this increases the area which is not filled with the resin 3. The resin-molded engine control unit can be enlarged easily while suppressing the increase of the amount of resin to be used.

Embodiment 3

Figure 7:
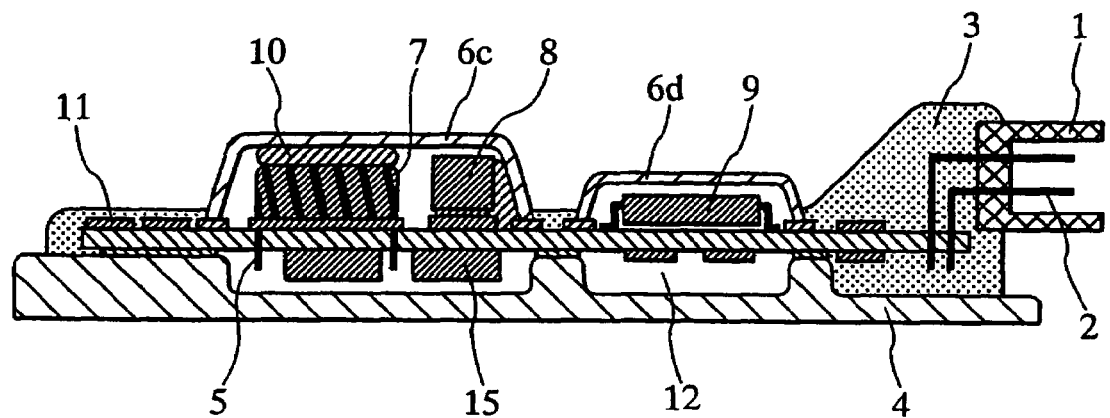
FIG. 7 is a cross sectional view of the structure of an engine control unit, a third embodiment of the present invention.

FIG. 7 is a cross sectional view of an engine control unit according to a third embodiment of the present invention. Components that are identical to those in the first embodiment are given the same reference numeral in FIG. 7 as in FIG. 1, and their description is omitted.

In the present embodiment, a microprocessor 9 to control an engine and a coil 7 and electrolytic capacitor 8 which produce noise and heat are capped by separate covers 6c and 6d. If some control problem occurs, the microprocessor 9 must be analyzed to locate the cause. Due to their properties, the coil 7 and electrolytic capacitor 8 are difficult to seal with resin. Therefore, the microprocessor 9, coil 7 and electrolytic capacitor 8 must be mounted in a region which is not filled with the resin 3.

However, the microprocessor 9 is vulnerable to high temperature as compared to other passive parts and FETs. In addition, protection from noise is critical to prevent its malfunction. Therefore, the present embodiment has two separate covers formed. The coil 7 and the electrolytic capacitor 8 are capped by the cover 6c while the microprocessor 9 is capped by the cover 6d.

Employing the above-mentioned configuration makes the microprocessor 9 less vulnerable to the temperature rise caused by the coil 7, electrolytic capacitor 8 and other heat-generating parts. In addition, due to shielding by the covers 6c and 6d from the coil 7, electrolytic capacitor 8 and other noise sources, the microprocessor 6 is made more immune to noise. Further, the shielding effect can be raised by electrically connecting the covers 6c and 6d to the ground of the electronic circuit or the case ground.

Embodiment 4

Figure 8:
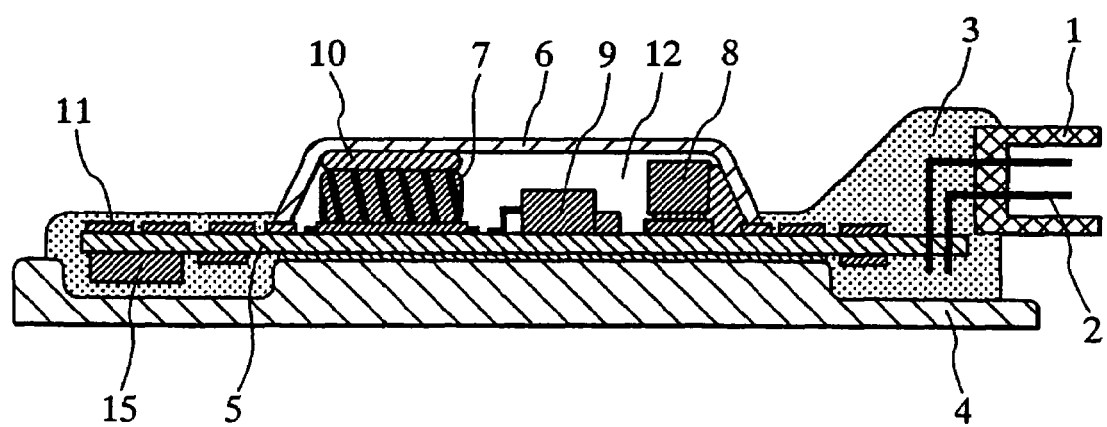
FIG. 8 is a cross sectional view of the structure of an engine control unit, a fourth embodiment of the present invention.

FIG. 8 is a cross sectional view of an engine control unit according to a fourth embodiment of the present invention. Components that are identical to the corresponding ones in the first embodiment are given the same reference numeral in FIG. 8 as in FIG. 1, and their description is omitted.

In the present embodiment, all of the parts capped by a cover 6 are surface mount electronic parts. In addition, via an adhesive, a base 4 is attached to the opposite side of the board 5, viewed from the side on which a resin-free space is secured by the cover 6. It is therefore possible to seal the board with resin without giving stress to the board 5 during resin molding. In addition, since the bottom side of the board 5 is supported by the base 4 via the adhesive, the present embodiment is structurally resistant to vibrations, shocks and temperature cycles.

In addition, by modifying the structure in such a manner that all electronic parts are mounted on the top side of the board 5 and the whole bottom side of the board 5 is made in contact with the base 4 by an adhesive, it is possible to provide a higher heat radiation type resin-molded engine control unit.

By employing the structure of the present invention, it is possible to realize an engine control unit which is superior in heat resistance, vibration resistance and shock resistance.

Embodiment 5

Figure 9:
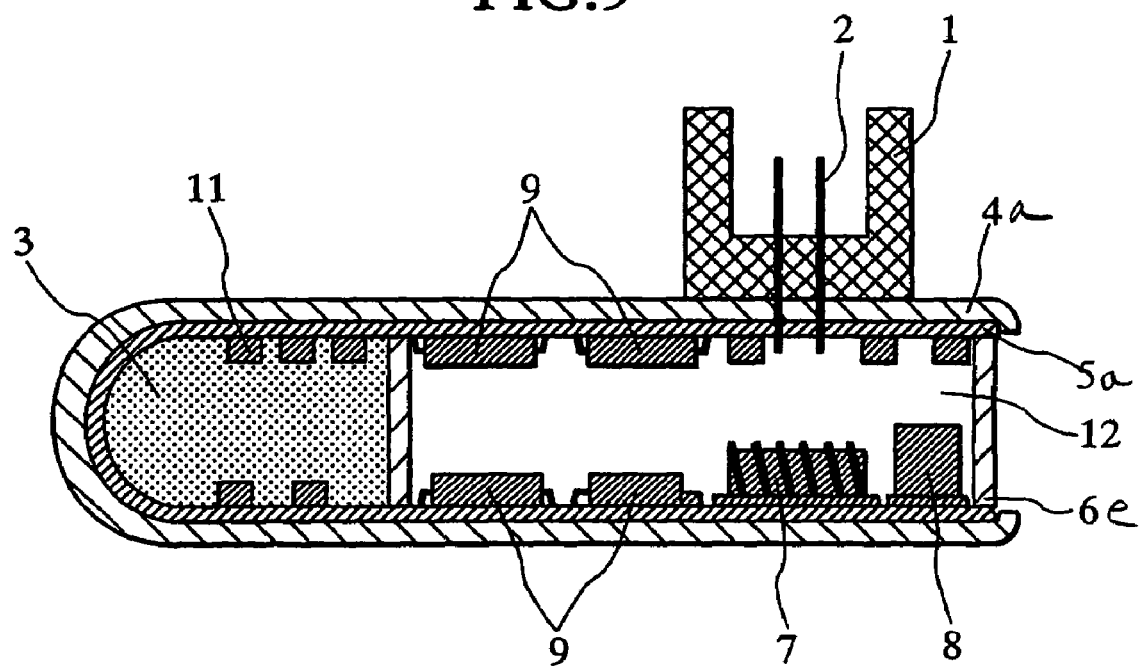
FIG. 9 is a cross sectional view of the structure of an engine control unit, a fifth embodiment of the present invention.

FIG. 9 is a cross sectional view of an engine control unit, in a fifth embodiment of the present invention. Components that are identical to the corresponding ones in the first embodiment are given the same reference numeral in FIG. 9 as in FIG. 1, and their description is omitted.

The board 5a of the present embodiment is a single flexible board. This board 5a is attached onto a base 4a by an adhesive compound, adhesive sheet or the like. After a plastic or metal cover 6e, electronic parts 8, 9 and 11 and a waterproof connector 1a are mounted, the board 5a having these electronic parts mounted thereon and the base 4a attached thereto is folded in two until aligned to the height of the 6e. Then, the unit is internally filled with the resin 3 but the region which is capped by the cover 6e is not filled with the resin. (See FIG. 12.)

The housing of the waterproof connector 1a is kept watertight by the base 4a and such a sealant as a sealing rubber or a liquid gasket. It is also possible to more strongly fix the waterproof connector 1a to the base 4a by using mechanical parts such as screws.

If electronic parts are sealed with the resin 3, heat is likely to stay within the unit since the thermal conductivity of the resin 3 is lower than that of metal. In the case of the present embodiment, the heat generated by the electronic parts is radiated to the base 4a via the flexible board 5a and the adhesive compound or adhesive sheet. By making the flexible board 5a and the adhesive compound or adhesive sheet respectively thinner than 1 mm, the perpendicular thermal resistance can be further lowered to realize a better heat radiation structure.

In addition, since the flexible board 5a is folded in two, the present embodiment can reduce the projected area of the board 5a to make the unit smaller. Further miniaturization is also possible by folding the board 5a more than once.

Embodiment 6

FIGS. 10A to 10H show a process of manufacturing an engine control unit, in a sixth embodiment of the present invention.

Figure 10A:
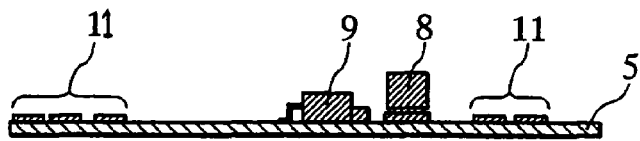
FIGS. 10A to 10H show a process of manufacturing an engine control unit which is either first, second or fourth embodiment of the present invention.

At first, after surface mount type small electronic parts 11 such as resistors, diodes and ICs, a surface mount type electronic part 9 such as a microprocessor and a surface mount type large electronic part 8 such as an electrolytic capacitor are mounted on the board 5, solder reflow is performed (FIG. 10A).

Figure 10B:
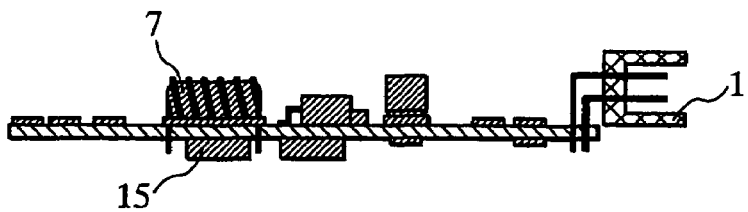

After a pin insertion type electronic part 7 such as a coil and a waterproof connector 1 are mounted on the top side of the board 5 and surface mount type small electronic parts 15 are mounted on the bottom side of the board 15, solder reflow is performed (FIG. 10B).

Figure 10C:
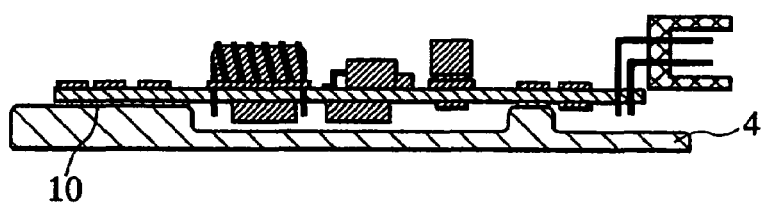
Figure 10D:
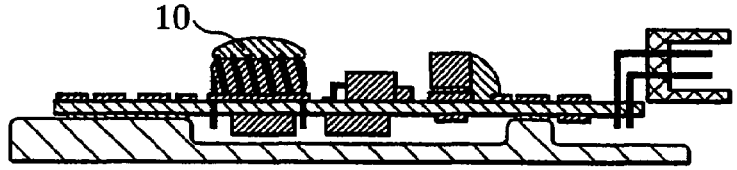

After an adhesive 10 is applied to the top of the base 4, the board 5 is attached onto it (FIG. 10C). Preferably, to attain improvement in electrical insulation and heat radiation, the adhesive is not thicker than 1 mm and consists of either a liquid adhesive or a sheet composed of a polyimide polyamide polyethyleneterephthalate core having both sides coated with a sticking agent.

Figure 10E:
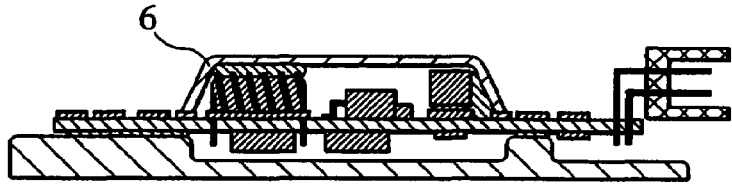
Figure 10F:
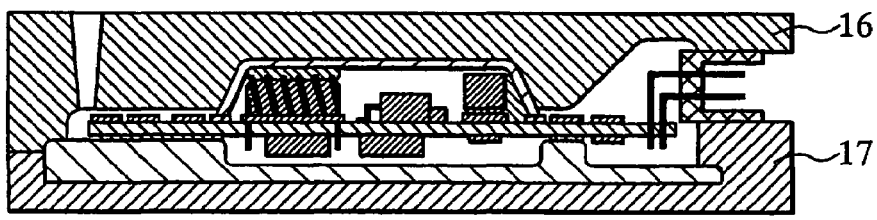

Then, after an adhesive 10 to fix the cover 6 onto the board 5 and an adhesive 10 to fix the cover 6 to a part which is to radiate heat to the cover 6 are applied (FIG. 10D), the cover 6 is fixed onto the board 5 (FIG. 10E).

Figure 10G:
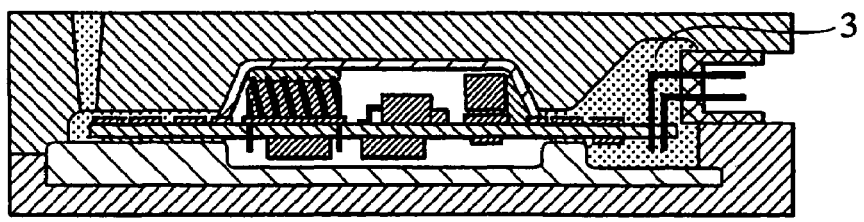

After the upper block 16 and lower block 17 of the molding die are set around the unit (FIG. 10F), resin molding is performed by injecting a resin 3 through the gate of the molding die (FIG. 10G). The resin molding pressure is not higher than 50 kgf/cm², the resin molding temperature is 100° C. to 200° C. and an epoxy resin with a phenol resin hardener is used as the resin 3. Preferably, the resin 3 has such properties that the linear expansion coefficient is 8 to 24 ppm/° C., the elastic modulus is 8 to 39 GPa and the glass transition temperature is 80 to 200° C.

Figure 10H:
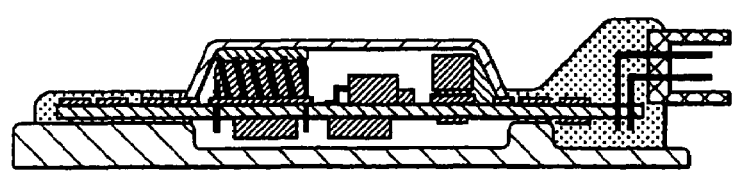

Finally, the molding die 16 and 17 is removed to complete the resin-molded engine control unit (FIG. 10H).

Embodiment 7

FIGS. 11A to 11H show a process of manufacturing an engine control unit, in a seventh embodiment of the present invention. If the unit has a plurality of covers 6c and 6d and a large-size board 5, resin injection molding may be difficult, namely, the resin may not spread well to every corner in the molding die.

Therefore, not like the sixth embodiment which uses resin injection technology, the present embodiment places resin pellets 18 placed on the unit. Resin molding is performed by giving heat and pressure to them from the molding resin.

Figure 11A:
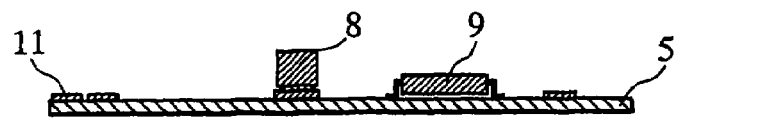
FIGS. 11A to 11H show a process of manufacturing an engine control unit which is the third embodiment of the present invention.

At first, after surface mount type small electronic parts 11 such as resistors, diodes and ICs, a surface mount type electronic part 9 such as a microprocessor and a surface mount type large electronic part 8 such as an electrolytic capacitor are mounted on the board 5, solder reflow is performed (FIG. 11A).

Figure 11B:
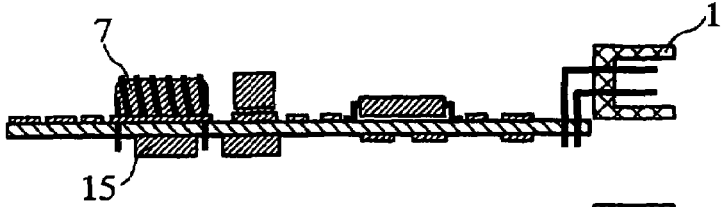

After a pin insertion type electronic part 7 such as a coil and a waterproof connector 1 are mounted on the top side of the board 5 and surface mount type small electronic parts 15 are mounted on the bottom side of the board 15, solder reflow is performed (FIG. 11B).

Figure 11C:
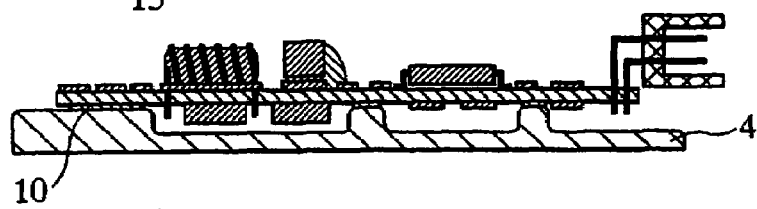
Figure 11D:
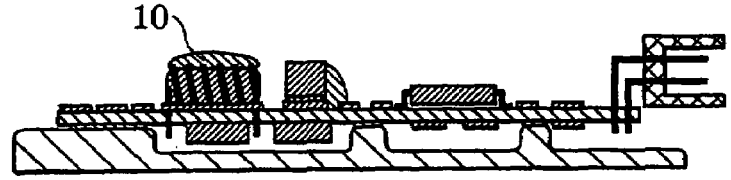

After an adhesive 10 is applied to the top of the base 4, the board 5 is attached onto it (FIG. 11C). Preferably, to improve electrical insulation and heat radiation, the adhesive 10 is not thicker than 1 mm and consists of either a liquid adhesive or a sheet composed of a polyimide polyamide polyethyleneterephthalate core having both sides coated with a sticking agent.

Figure 11E:
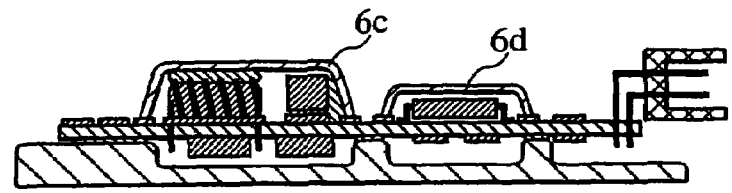

Then, after an adhesive 10 to fix the covers 6 onto the board 5 and an adhesive 10 to fix a cover 6 to a part which is to radiate heat to the cover 6 are applied (FIG. 1D), the covers 6c and 6d are fixed onto the board 5 (FIG. 11E).

Figure 11F:
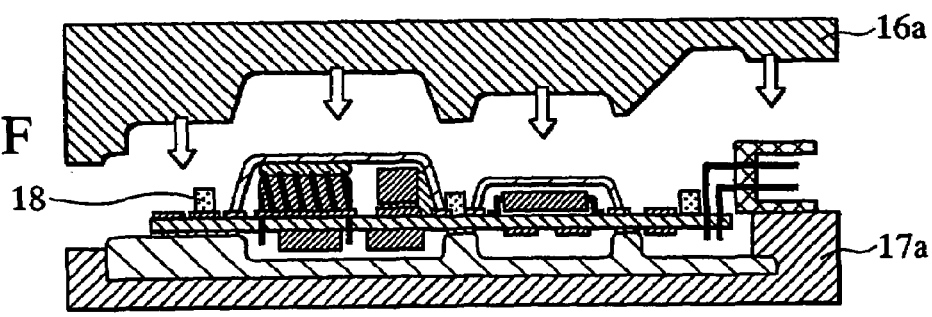
Figure 11G:
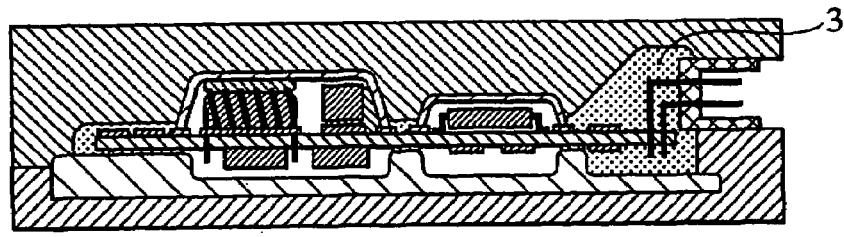

A resin pellet 18 is placed in at lease one place on the board 5 and the molding die 16 and 17 is set around the unit (FIG. 11F). The molding die 16 and 17 is closed to complete resin molding as the resin pellets 18 are melted due to the heat received from the molding die 16 and 17 (FIG. 11G). The resin molding pressure is not higher than 50 kgf/cm², the resin molding temperature is 100° C. to 200° C. and an epoxy resin with a phenol resin hardener is used as the resin 3. Preferably, the resin 3 has such properties that the linear expansion coefficient is 8 to 24 ppm/° C., the elastic modulus is 8 to 39 GPa and the glass transition temperature is 80 to 200° C.

Figure 11H:
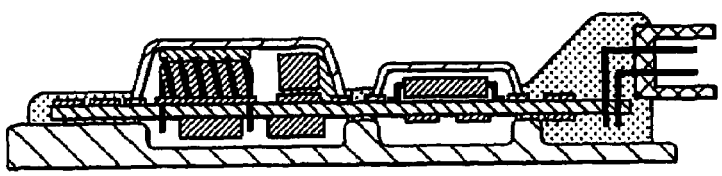

Finally, the molding die 16 and 17 is removed to complete the resin-molded engine control unit (FIG. 11H).

Embodiment 8

FIGS. 12A to 12H show a process of manufacturing an engine control unit, an eighth embodiment of the present invention. Preferably, the board 5a used in the present embodiment is a flexible board composed of a polyimide resin and a liquid crystal polymer.

At first, an adhesive is applied to the top of the base 4a, the board 5a is attached onto it (FIG. 12A) Preferably, to improve electrical insulation and heat radiation, the adhesive is not thicker than 1 mm and consists of either a liquid adhesive or a sheet composed of a polyimide polyamide polyethyleneterephthalate core having both sides coated with a sticking agent. In addition, the adhesive preferably has electrical insulation and heat radiation properties such that it can endure the resin molding temperature of 100° C. to 200° C.

Figure 12A:
FIGS. 12A to 12H show a process of manufacturing an engine control unit which is the fifth embodiment of the present invention.
Figure 12B:

Then, after surface mount type small electronic parts 11 such as resistors, diodes and ICs, a surface mount type electronic part 9 such as a microprocessor and a surface mount type large electronic part 8 such as an electrolytic capacitor are mounted on the board 5a, solder reflow is performed (FIG. 12B).

Figure 12C:
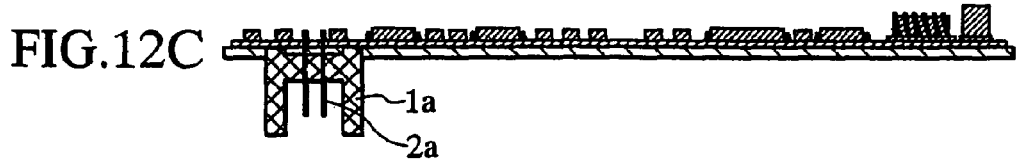

A waterproof connector 1a is attached to the board 5a from the direction of the base 4a and soldered thereto (FIG. 12C). The waterproof connector 1a has terminals 2a by which the internal circuit formed on the board 5a is electrically connect to an external circuit. The housing of the waterproof connector 1a is kept watertight by the base 4a and such a sealant as a sealing rubber or a liquid gasket. It is also possible to more strongly fix the waterproof connector 1a to the base 4a by using mechanical parts such as screws.

Figure 12D:
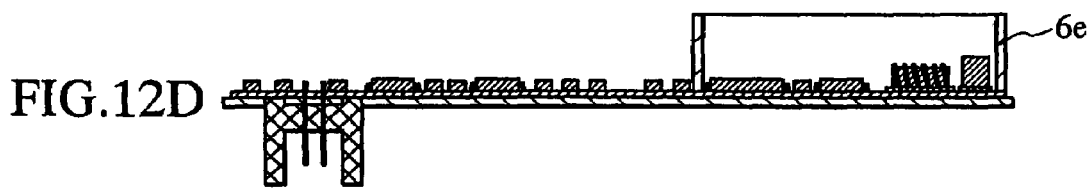
Figure 12E:
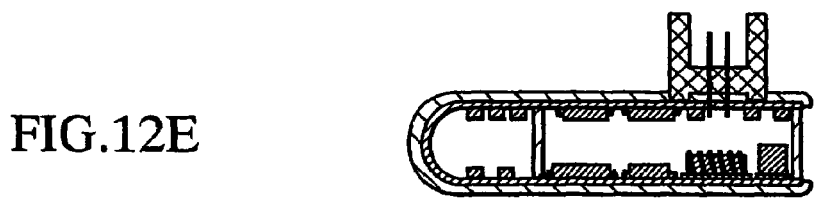
Figure 12F:
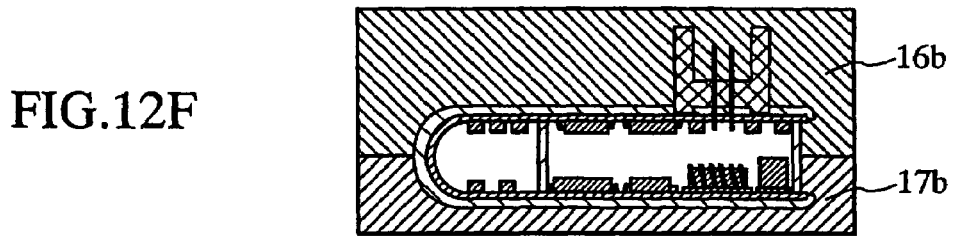
Figure 12G:
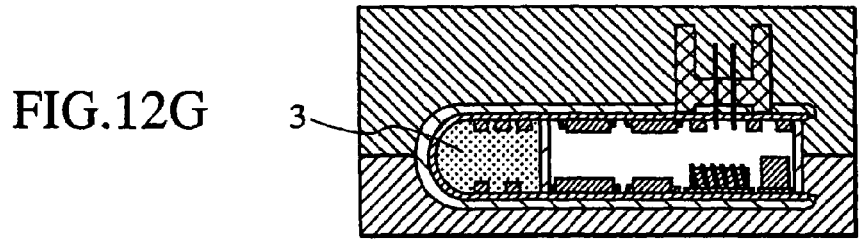
Figure 12H:
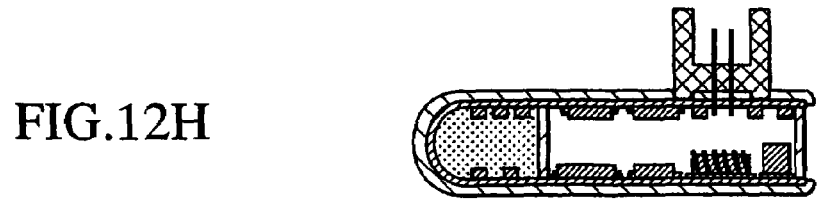

Then, a cover 6e is attached onto the board 5a (FIG. 12D). The board 5a having electronic parts mounted thereon is folded together with the base 4a until aligned to the height of the cover 6e (FIG. 12E). After the upper block 16b and lower block 17b of the molding die are set around the unit (FIG. 12F), resin molding is performed by injecting the resin 3 through the die gate (FIG. 12G). Finally, the molding die 16 and 17 is removed to complete the resin-molded engine control unit (FIG. 12H).

Embodiment 9

Figure 13A:
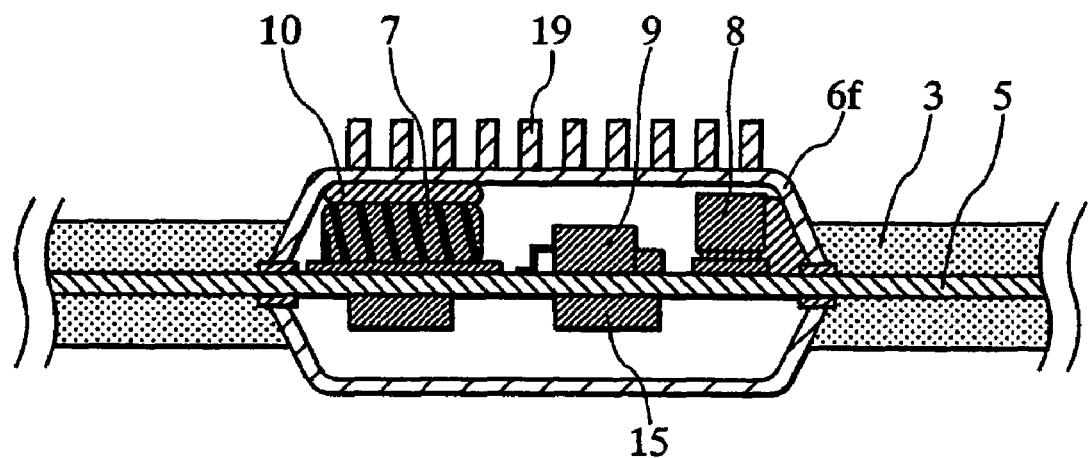
FIGS. 13A and 13B are cross sectional views of the structure of an engine control unit, a ninth embodiment of the present invention.
Figure 13B:
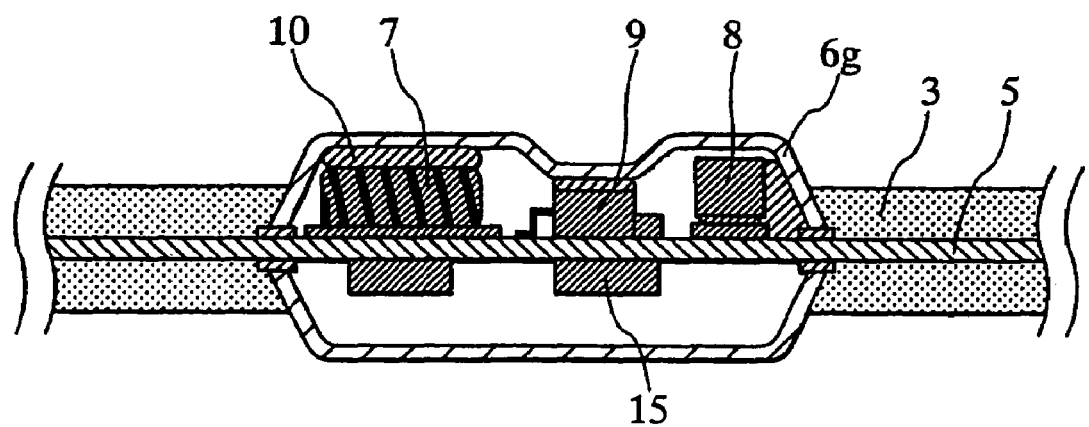

FIGS. 13A and 13B are cross sectional views of an engine control unit, a ninth embodiment of the present invention. Components that are identical to those in the first embodiment are given the same reference numeral in FIGS. 13A and 13B as in FIG. 1, and their description is omitted.

A typical common rail system for diesel engines requires more current and more minute than an ordinary injector drive circuit since the fuel injection pressure is higher. Therefore, an engine control unit for a common rail system usually contains a voltage booster. This voltage booster includes a large electrolytic capacitor and a large coil for voltage boosting. Usually, these parts mounted on the board produce larges amounts of heat. Accordingly, in the present embodiment, electronic parts which are difficult to seal with resin are mounted in resin-free regions with a structure to cool down these parts.

In FIG. 13A, a higher heat generation structure is realized by adding radiation fins 19 to the cover 6. A coil 7 and a capacitor 8 are respectively made in contact with the cover 6 by adhesive 10. The heat produced by these electronic parts is radiated from the heat radiation fins 19 via the cover 6. Therefore, the appropriate material of the cover 6 such a metal as aluminum or copper which is inexpensive but has high thermal conductivity.

In the structure of FIG. 13B, heat radiation from an electronic part 9 (microprocessor or the like) is facilitated in addition to the heat radiation from the coil 7 and capacitor 8. While each electronic part has a different height, the shape of the cover 6 is changed so as to maximize the heat radiation from each electronic part. This makes it possible to give a uniform heat radiation structure to each part which has a different height.

Embodiment 10

FIGS. 14A to 14E are cross sectional views of an engine control unit, in a tenth embodiment of the present invention, and show a method of mounting a cover.

To form a resin-free region by the cover 6 and board 5 during resin molding outside the region, it is necessary to seal the boundary between the cover 6 and the board 5. Several different techniques for such sealing are shown in FIG. 14.

Figure 14A:
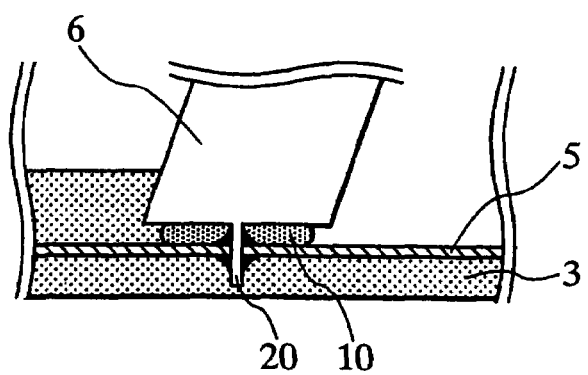
FIGS. 14A to 14E are cross sectional views of the structure of an engine control unit, a tenth embodiment of the present invention.

In the method of In FIG. 14A, resin molding is performed after the boundary between the cover 6 and the board 5 is sealed by applying an adhesive, sealant or the like to the circumference of the cover 6. In this structure, the cover 6 can provide shielding effect if it is made of a conductive material such as a metal. In particular, it is difficult to attain shielding effect from metal in conventional resin-molded structures. If the structure of the present embodiment is employed, it is possible to improve the noise immunity of an engine control microprocessor or the like which is mounted inside the cover 6.

Preferably, the cover 6 is electrically connected to the ground of the electronic control unit or the case earth if the cover 6 is made of a metal since it may rather lower the noise immunity if left floating. In FIG. 14A, the cover 6 is therefore designed to have at least two pins 20 for insertion through the board 5. These insertion pins 20 are electrically connected to the ground of the board 5.

Figure 14B:
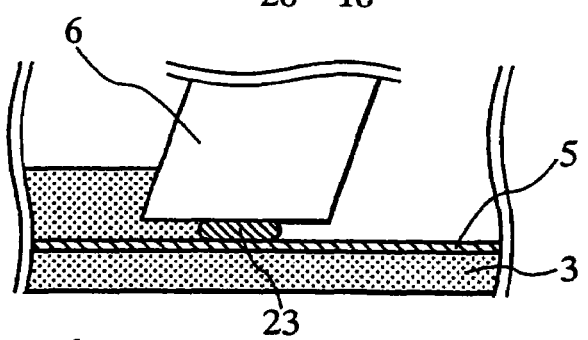

In FIG. 14B, solder is placed between the cover 6 and the board 5 along the circumference of the cover 6. The cover 6 is attached to the board 5 by the solder 23. The solder serves not only to electrically connect the cover 6 to the board ground but also to stop the resin.

Figure 14C:
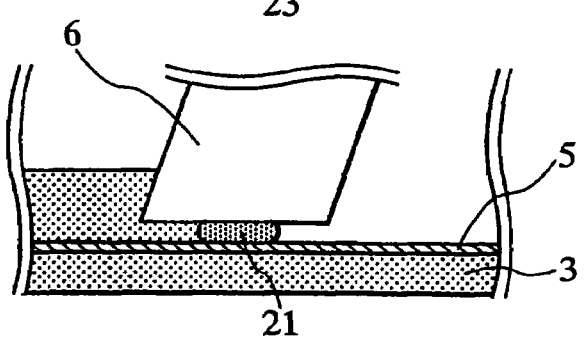

In FIG. 14C, a conductive adhesive 21 is used between the cover 6 and the board 5 along the circumference of the cover 6. The conductive adhesive 21 serves not only to electrically connect the cover 6 to the board but also to stop the resin.

Figure 14D:
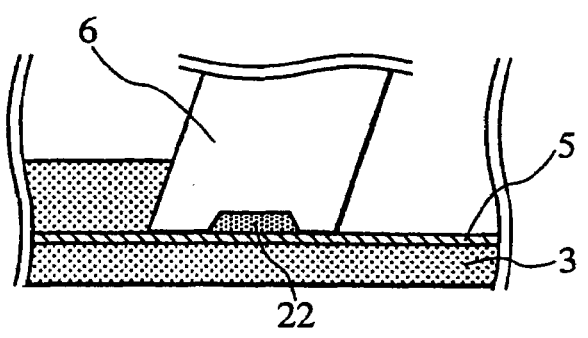

In FIG. 14D, the cover 6 has a dent 22 formed where sealant is inserted. This allows reliable sealing even if the cover 6 is dimensionally not precise.

Figure 14E:
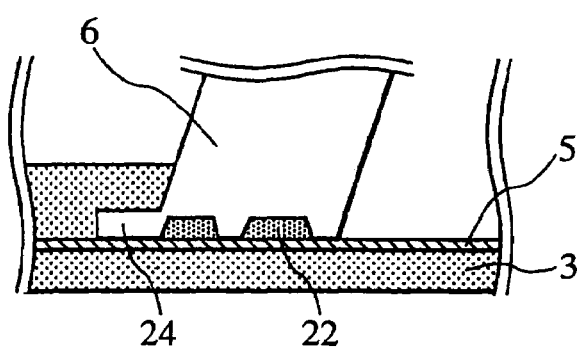

In FIG. 14E, a double seal structure is employed to enhance the sealing performance of that shown in FIG. 14 D. Further, to increase the area of contact between the cover 6 and the base 5, the rim of the cover 6 has a projecting portion 24 which is parallel to the board 5.

Embodiment 11

Figure 15A:
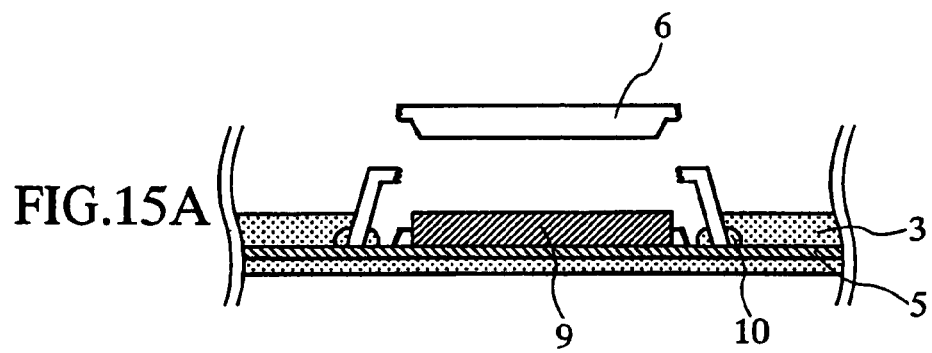
FIGS. 15A to 15C are cross sectional views of the structure of an engine control unit, an eleventh embodiment of the present invention.
Figure 15B:
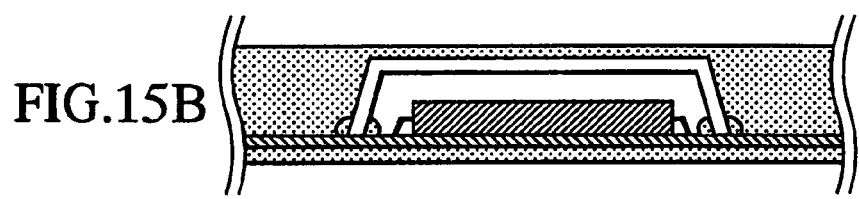
Figure 15C:
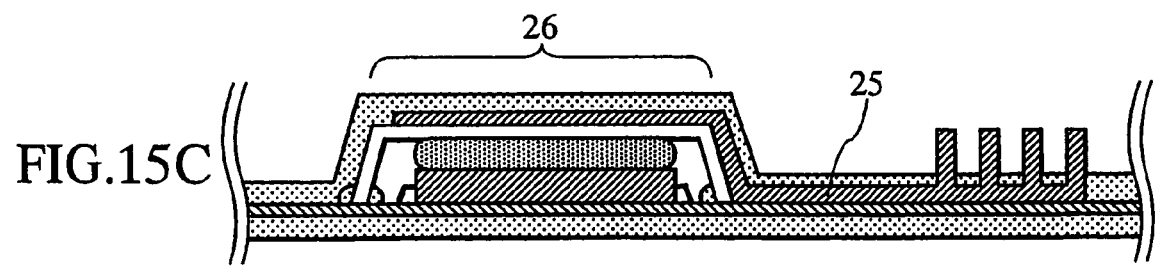

FIGS. 15A to 15C are cross sectional views of an engine control unit, an eleventh embodiment of the present invention.

A cover 6 shown in FIG. 15A is structured so that it is possible to open the top of the cover 6 which caps a microprocessor 9. In case some problem is found, it is possible to open the top of the cover 6 and analyze the microprocessor 9. Note that although a microprocessor 9 is capped by the cover 6, this openable structure can also be applied to other electronic parts such as electrolytic capacitors and coils in order to facilitate analysis of them as necessary.

In FIG. 15B, a cover 6 is entirely capped by resin 3 so that outsiders can not locate the cover 6. This can prevent outsiders from opening the cover 6 easily.

The method shown in FIG. 15C is used in particular when metal can not be exposed as part of the surface of the unit. This allows the unit to be installed even in an area 26 where heat radiation is prohibited since heat is carried to another place and radiated therefrom by a high thermal conductivity metal layer 25, heat pipe or the like.

Although specific embodiments of the present invention are described so far in detail, the present invention is not limited to these embodiments and various changes and applications are possible within the scope of the engineering philosophy. For example, although a coil 7, electrolytic capacitor 8 and microprocessor 9 are all mounted in resin-free regions in the description of each aforementioned embodiment, the present invention is not limited to this structure. If any one of the coil 7, electrolytic capacitor 8 and microprocessor 9 is mounted in a resin-free region according to the characteristics of the engine control unit and these electronic parts, this structure is within the scope of the present invention. In addition, mounting any other kind of part, which should not be sealed with resin, in a resin-free region is within the scope of the present invention.

The present invention is applicable to motor control units, automatic shift control units and various other control units and pressure sensor modules, air meter modules and other sensor modules in order to, for example, improve them in productivity and reliability and make them smaller.

Further, aimed at not only cost reduction but also improvement in installation flexibility, the present invention is also applicable to brake control modules, suspension control modules, steering control modules, airbag control modules, seatbelt control modules, vehicle-to-vehicle distance measuring modules and other various control modules to provide active safety functions, mobile phone communication control modules, ETC communication modules, GPS communication modules, VICS communication modules and other various electronics modules to obtain ITS and other functions through information exchange with the outside by wireless communication and fuel battery control modules, lithium ion battery charge and discharge control modules and other various chemical resistance-critical control modules to control chemical reaction-based apparatus.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An electronic control unit comprising:
    a metal base;
    a printed board fixed onto the metal base;
    at least one cover fixed onto the printed board;
    an electrolytic capacitor, a coil and a microprocessor which are mounted inside the at least one cover on the printed board; wherein,
    a plurality of electronic parts which are mounted outside the at least one cover on the printed board; and
    a connector which is provided with a terminal connected to the printed board; wherein,
    the printed board and the plurality of electronic parts outside the at least one cover are sealed with a resin; and
    a space formed by fixing the printed board onto the metal base and the inside of the at least one cover are resin-free regions.

2. The electronic control unit according to claim 1, wherein:
    the cover is made of a metal; and
    the electrolytic capacitor and the coil are fixed to the cover by using an adhesive.

3. The electronic control unit according to claim 1, wherein the top of the cover is detachable.

4. The electronic control unit according to claim 1, wherein the cover is sealed with the resin.

5. The electronic control unit according to claim 1, wherein said space and the cover are located so as to face each other via the board.

6. The electronic control unit according to claim 1, wherein:
    the electrolytic capacitor, the coil and the microprocessor are mounted on a first main side of the board;
    a surface mount type electronic part is mounted on a second main side of the board which is opposite to the first main side;
    the at least one cover comprises a first cover and a second cover;
    the first cover is fixed onto the board to cap the electrolytic capacitor and the coil;
    the second cover is fixed onto the board to cap the microprocessor; and
    the insides of the first and second covers are respectively resin-free regions.

7. The electronic control unit according to claim 6, wherein the surface mount type electronic part is mounted in the resin-free region on the board.

* * * * *